United States Patent [19]

Houston

[11] Patent Number: 5,596,286
[45] Date of Patent: Jan. 21, 1997

[54] CURRENT LIMITING DEVICES TO REDUCE LEAKAGE, PHOTO, OR STAND-BY CURRENT IN AN INTEGRATED CIRCUIT

[75] Inventor: Theodore W. Houston, Richardson, Tex.

[73] Assignee: Texas Instruments Incorporated, Dallas, Tex.

[21] Appl. No.: 570,368

[22] Filed: Dec. 11, 1995

Related U.S. Application Data

[63] Continuation of Ser. No. 431,394, Apr. 28, 1995, which is a continuation of Ser. No. 150,927, Nov. 12, 1993.

[51] Int. Cl.$^6$ ................................................. H03K 17/16
[52] U.S. Cl. ................................................. 326/33; 326/27
[58] Field of Search .............................. 307/443, 451, 307/452, 475, 530; 365/189.06, 226; 326/27, 33, 34, 121

[56] References Cited

U.S. PATENT DOCUMENTS

| | | | |
|---|---|---|---|
| 4,089,062 | 5/1978 | McElroy et al. | 364/700 |
| 4,115,705 | 9/1978 | McElroy et al. | 307/140 |
| 4,347,586 | 8/1982 | Natsui | 365/225.6 X |
| 4,555,642 | 11/1985 | Morales | 307/475 |
| 4,692,637 | 9/1987 | Shoji | 307/452 X |
| 4,972,102 | 11/1990 | Reis et al. | 326/121 X |
| 5,039,893 | 8/1991 | Tomisawa | 327/276 |
| 5,107,139 | 4/1992 | Houston et al. | 307/296.5 |
| 5,179,298 | 1/1993 | Hirano et al. | 307/443 |
| 5,233,240 | 8/1993 | Kashimura | 326/121 X |
| 5,235,218 | 8/1993 | Matsuo et al. | 307/443 |
| 5,345,112 | 9/1994 | Nazarian et al. | 307/443 |

*Primary Examiner*—David R. Hudspeth
*Attorney, Agent, or Firm*—Jacqueline J. Garner; Richard L. Donaldson; William E. Hiller

[57] ABSTRACT

A current limiting circuit 12 is placed between a supply voltage, Vcc and circuitry 14. Current limiting circuit 12 supplies sufficient current for normal operation of circuitry 14, but less than would be required if all potentially conductive paths of circuitry 14 were active at one time. Current limiting circuit 12 may be operable to either limit or interrupt the flow of current between Vcc and circuitry 14 in response to a control signal. A second current limiting device 16 may be placed between circuitry 14 and a second supply voltage, VSS.

27 Claims, 2 Drawing Sheets

CURRENT LIMITING DEVICES TO REDUCE LEAKAGE, PHOTO, OR STAND-BY CURRENT IN AN INTEGRATED CIRCUIT

This application is a Continuation of application Ser. No. 08/431,394, filed Apr. 28, 1995, which is a Continuation, of application Ser. No. 08/150,927 filed Nov. 12, 1993.

FIELD OF THE INVENTION

This invention generally relates to semiconductor devices and more specifically to selective current limits in semiconductor devices.

BACKGROUND OF THE INVENTION

The surge of leakage, or photo current, that occurs in an integrated circuit during exposure to a high level burst of ionizing radiation (often referred to a transient radiation) can cause a reduction in the supply voltage internal to the integrated circuit. In extreme cases, this reduction in supply voltage, commonly referred to as rail span collapse, can cause loss of information stored in latches or memory arrays, or cause malfunction of logic circuits. Low voltage applications are particularly susceptible to rail span collapse because of their smaller theoretical dynamic range. Thus, a much smaller current leakage level will adversely impact a low voltage device than other devices. Generally, it is preferable to stop operation of the circuit rather than corrupt stored information. Further, it is desirable to protect stored information when the circuit is in standby.

Many methods have been developed to reduce data corruption when an integrated circuit is exposed to transient radiation. Most of them involve improved ways to manufacture individual elements (i.e., transistors, etc.) or ways to detect transient dose conditions. However, there is a need for improved ways to limit current especially for low voltage applications.

CMOS circuits generally have low standby current. However, accumulated exposure to ionizing radiation can increase leakage. Also, leakage currents may increase as threshold voltages are lowered to retain performance with reduced power supply voltages. Therefore, there is also a need to reduce standby current in CMOS circuits.

SUMMARY OF THE INVENTION

A device and method for selectively limiting current to a circuit. The circuit comprises a plurality of circuit elements. Each of the circuit elements are operable to provide a conduction path but less than all of the circuit elements are active at any one time. A current limiting device is placed between the plurality of circuit elements and a supply voltage.

In one embodiment a first signal is provided to a gate of the current limiting device when the current level is less than a threshold level such that the current limiting device connects the supply voltage to the circuit. A second signal is provided to the gate of the current limiting device when the current level exceeds the threshold level such that the current limiting device interrupts the supply voltage from the circuit. In another embodiment, the current conducted through the current limiting transistor is limited to a threshold current level.

An advantage of the invention is providing a current limiting device in series with a section of circuitry.

Another advantage of the invention is providing selective current limits for sections of circuitry.

These and other advantages will be apparent to those skilled in the art having reference to the specification in conjunction with the drawings and claims.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The preferred embodiments of the invention will be described in conjunction with various CMOS circuits. It will be apparent to those skilled in the art that other CMOS circuits as well as MOS, BiCMOS, and bipolar circuits can also realize the benefits of the invention.

Figure 1:
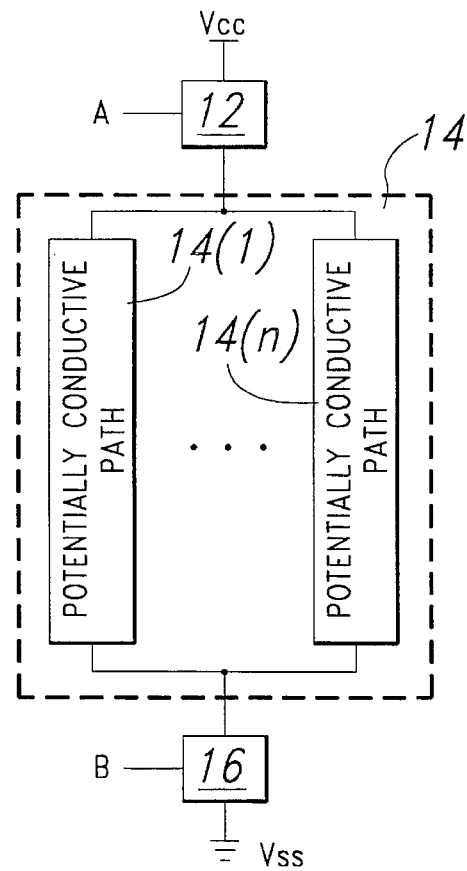
FIG. 1 is a schematic diagram of a selective current limiting circuitry according to the preferred embodiment of the invention.

Referring to FIG. 1, a current limiting device 12 is connected between a supply voltage Vcc and a subset of circuit elements 14 in an integrated circuit such that the current limiting device 12 supplies sufficient current for normal operation, but reduces the leakage or photo current during a transient dose of radiation to less than would occur in the absence of the current limiting device. This will reduce rail span collapse, and thus reduce the probability of logic failure or data corruption in other portions of the integrated circuit. As an example, in CMOS circuitry, both the "on" conduction and at least some components of the leakage or photo current of a transistor are proportional to the transistor width. Further, a circuit may have a plurality of potential conduction paths from one supply voltage to another, not all of which are simultaneously active during normal operation. As a result, the current limiting device width needs to be sufficient to supply the current for only those paths that are simultaneously active. This width can be less than the cumulative width of the controlling devices in the potentially conducting paths in the circuit. During exposure to a burst of ionizing radiation, the photo current from the subset of the circuit 14 supplied by the current limiting device 12 will cause an increased voltage drop across the current limiting device, and thus reduce the voltage across the circuit subset 14. This will reduce the photo current from the circuit subset 14, and thus reduce the rail span collapse to the rest of the circuit. In one embodiment, this effect is enhanced by reducing the conductivity of the current limiting device 12 in the event of a burst of radiation. In another embodiment, the conductivity of the current limiting device 12 is reduced when the subset of the circuit 14 supplied by the current limiting device 12 is not active, such as in standby. In this embodiment, leakage current, as might be caused by cumulative exposure to ionizing radiation, is also reduced.

Integrated circuits have many instances of subsets of circuit elements that comprise a plurality of potential conduction paths from one voltage supply to another, not all of which are simultaneously active in normal operation. One type of this situation is the occurrence of two or more similar logic gates in parallel, of which only a subset are active at one time. For example, in a common memory design, there are address decoders with multiple outputs, only one of which is selected at a time. Similarly, only one, or a subset, of wordline drivers is simultaneously selected.

Another type of the situation in which an integrated circuit has a subset of circuit elements that comprise a plurality of potential conduction paths from one voltage supply to another, not all of which are active at the same time, is a sequence of logic gates that are activated sequentially. For example, in an inverter chain a signal sequences from one inverter to the next, and not all inverters are active at the same time. Further, as one signal propagates through an inverter chain, alternate inverters will draw current from one voltage supply while intervening inverters draw current from the other supply.

Yet another type of the situation above is the grouping of circuit elements, the functions of which will not be active at the same time. For example, in some memory designs, the sense amplifiers used in READ and the column drivers used in WRITE will not both be active at the same time.

Figure 4:
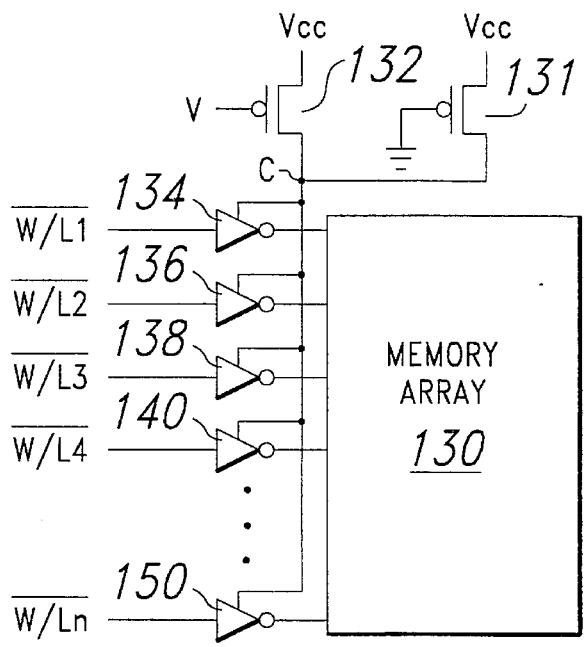
FIG. 4 is a schematic diagram of the preferred embodiment of the invention applied to a wordline drivers of a memory device.

The preferred embodiment of the invention is shown in FIG. 1, where circuitry 14 comprises a plurality of potentially conducting paths 14.1 through 14.n from one supply voltage to the other, not all of which are active at the same time during normal operation. Each of the circuits 14.1 through 14.n may have input and output, some of which may be interconnected. A current limiting circuit 12 may be placed between the supply voltage Vcc and circuitry 14. Circuit 12 may be a p-channel transistor. Alternatively, a n-channel transistor may be used. Circuitry 14 may, for example, comprise a logic circuit, a memory, an inverter chain, or other similar circuit for which selective current limiting is desired. A second current limiting circuit 16 may be placed between circuitry 14 and ground, GND. It should be noted that in most applications only circuit 12 (or alternatively only circuit 16) will be used. The decision about whether to use a current limiting circuit between circuitry and ground or the circuitry and Vcc depends on the preferred state of the circuitry (if there is one). As an example, if a wordline signal is low for deselect, current limiting may be applied to a wordline driver to show a preference for a low output. An example of this is shown in FIG. 4 and will also be discussed below. Many other examples of using current limiting circuits such as circuits 12 and 16 to achieve a preferred state in a particular circuit will be apparent to those skilled in the art having reference to this specification.

Circuits 12 and 16 may be used to limit the current in circuitry 14 in several ways. For example, circuit 12 may be used to turn off power to circuitry 14 in a full circuit standby mode or a block standby mode. To accomplish a full circuit standby mode, current limiting circuit 12 could be a p-channel transistor with the gate connected to a CE_ signal. On the other hand, to accomplish a block standby mode, an inverse block enable signal could be used. The generation of such enabling signals is well known in the art. When used to turn off power to circuitry, either in full circuit standby or block standby, the current limiting circuit (12, 16) reduces susceptibility to data corruption in data storage elements in other parts of the integrated circuit in the event of a burst of radiation during that full circuit or block standby. It also reduces power dissipation in standby due to any leakage mechanisms that would otherwise be greater than the leakage of the current limiting circuit in its power-off state.

Instead of using a power off mode in standby, transistor 12 may be used to limit the amount of current to circuitry 14, independent of circuit activity. This can be accomplished with the circuitry 12 being a p-channel transistor with gate tied to ground. Circuit 12 thus allows current to flow to circuitry 14. The maximum amount of current that flows depends on the size of the p-channel transistor. The designer may choose the width of this transistor depending on the elements that make up circuitry 14. In a preferred embodiment, the width of the p-channel transistor in circuit 12 is greater than the maximum width of any p-channel transistor in circuitry 14, but less than the total width of controlling p-channel transistors in circuitry 14.

The circuit in FIG. 1 may be a subset of the total circuitry of an integrated circuit. Inclusion of current limiting circuit 12 and/or current limiting circuit 16 reduces the probability of data corruption or logic error in the remaining circuitry of the total integrated circuit (not shown) in the event of a burst of ionizing radiation.

Specific examples will be discussed hereinbelow.

Alternatively, circuits 12 and 16 may be used to disable circuitry 14 upon a certain event such as high current leakage associated with transient dose. In normal operation, both circuits 12 and 16 are in a high conductive state. Only when the current goes above a selected threshold are circuits 12 and 16 put into a low conductive state. For the embodiment in which circuit 12 is a p-channel transistor gated by control signal A, and circuit 16 is an n-channel transistor gated by control signal B, circuit 12 is put in the low conductive state by taking signal A high, and circuit 16 is put in the low conductive state by taking signal B low. Signal A is normally low and is only high when the leakage current goes above a selected threshold. Signal B is normally high and only goes low when leakage current goes above a selected threshold. Signals A and B may be generated by any number of means as is well known in the art. Several examples of circuitry for generating signals such as A and B are described in U.S. Pat. No. 5,107,139, issued Apr. 21, 1992 and assigned to Texas Instruments, Inc. and is hereby incorporated by reference.

Figure 2:
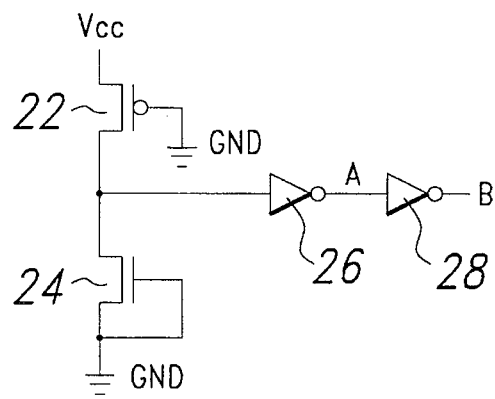
FIG. 2 is a schematic diagram of a current threshold detection circuitry used in accordance with the preferred embodiment of the invention.

A preferred circuit for generating signals A and B for the transient dose case is shown in FIG. 2 and will now be described. P-channel transistor 22 is connected between Vcc and the input to inverter 26. The gate of p-channel transistor 22 is connected to ground. N-channel transistor 24 is connected between the input to inverter 26 and ground. The gate of n-channel transistor 24 is also connected to ground. Accordingly, in normal operation, p-channel transistor 22 is "on" and n-channel transistor 24 is "off" thus making the input to inverter 26 high and signal A low. P-channel transistor 22 is a narrow width and therefore high resistivity transistor. N-channel transistor 24 is wide, low resistivity transistor. The ratio of the widths of transistors 22 and 24 is chosen to select a desired threshold current for an "off" transistor. When the desired threshold is reached, n-channel transistor 24 conducts enough current to overpower transistor 22 thus bringing the input to inverter 26 low and signal A high. As the ratio of the width of transistor 24 to the width of transistor 22 is increased, the selected threshold current of an "off" transistor decreases. In the preferred embodiment, the width of transistor 24 is 5–15 times larger than the width of transistor 22. Inverter 28 is placed between signal A and signal B thus making them inverses of each other. Other methods of generating signals A and B will be apparent to those skilled in the art.

Figure 3:
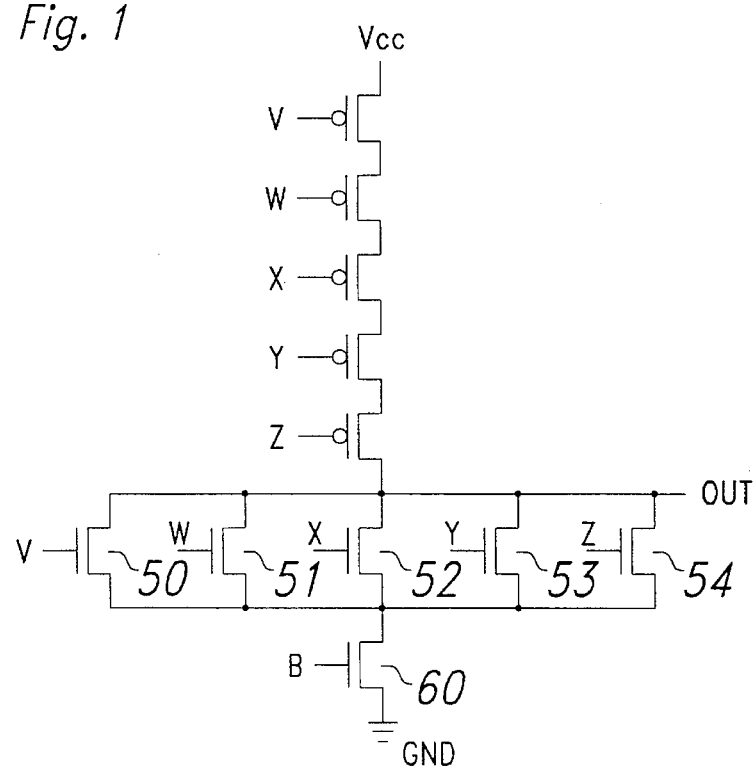
FIG. 3 is a schematic diagram of the preferred embodiment of the invention applied to a 5 input NOR circuit.

FIG. 3 shows the preferred embodiment of the invention applied to a 5 input NOR logic circuit. In a NOR circuit such as the one shown in FIG. 3, if any of the inputs, shown as V-Z, are high the output OUT will be low. Accordingly, only one of transistors 50–54 need to be on to provide the correct output signal. The current from Vss to the NOR circuit could thus be limited by current limiting transistor 60 to the current required to operate only one of transistors 50–54. If signal B is "high", the photo current would be limited by the width of transistor 60 which, in the preferred embodiment, is designed to be significantly less than the total width of transistors 50–54. Alternatively, signal B may be tied to a chip enable or block enable signal to provide a standby mode, or tied to a transient dose detector such as that shown in FIG. 2. When signal B goes "low", Vss is disconnected from the NOR circuit, thereby reducing power dissipation since the leakage is limited by the width of 60 rather than he total width of 50–54. Because current limiting transistor 60 is placed between the NOR circuit and ground, the output OUT will have a preference to be "high".

FIG. 4 shows the preferred embodiment of the invention applied to a block of wordlines, W/L1-W/Ln, in a memory device. Each of wordline drivers 134–150 drives a row of memory cells in memory array 130. It should be noted that wordline drivers 134–150 may represent all of the wordline drivers on a device or only a block of them. In the latter case, a current limiting transistor similar to current limiting device 132 may be provided for each block of wordlines. Current limiting device 132 is inserted in series with wordline drivers where, in normal operation, only one wordline is active at a time. Therefore, the current to the block of wordline drivers 134–150 may be limited to that needed by just one wordline. This may be accomplished by tying the gate of transistor 132 to ground and sizing transistor 132 such that its width is significantly less that the total width of the p-channel transistors in wordline drivers 134–150. If a standby mode is also desired, the gate of current limiting transistor may instead be connected to a chip enable signal or a block enable signal.

If an enable signal is connected to the gate of current limiting transistor 132, care needs to be taken to ensure that current limiting transistor 132 responds fast enough to supply wordline drivers 134–150 with Vcc in time to access the memory array 130. In the preferred embodiment, a small transistor 131 having its gate tied to ground could be placed in parallel with transistor 132. This would reduce the response time requirements on current limiting transistor 132 because the voltage at node C could be at Vcc before the block or chip were enabled and a wordline taken high. Transistor 131 is optional.

Alternatively, the gate of current limiting transistor 132 may be connected to a threshold current detector such as that shown in FIG. 2. Under high leakage conditions, such as transient dose, a voltage drop will develop across the current limiting device, but the cumulative effect on the whole circuit will be reduced. Although, a current limiting device may also or alternatively be placed between the wordline drivers 134–150 and ground, the preferred embodiment places current limiting device 132 between the wordline drivers 134–150 and Vcc because it is desirable to keep all wordlines W/L1-W/Ln low to avoid inadvertently accessing a memory cell.

Figure 5:
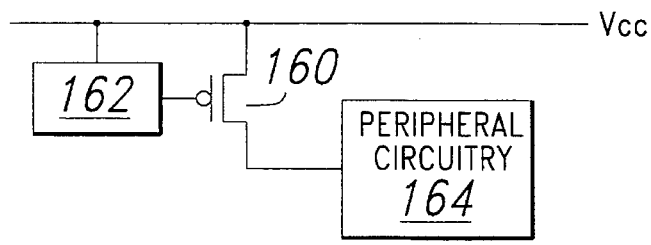
FIG. 5 is a schematic diagram of the preferred embodiment of the invention applied to peripheral circuitry.

FIG. 5 shows the preferred embodiment of the invention applied to peripheral circuits. Current limiting transistor 160 is placed between Vcc and peripheral circuitry 164. Peripheral circuitry 164 may be part of a memory device (not shown) in which it would be beneficial to turn off the peripheral circuitry 164 to protect the memory array. Current detector circuitry 162 is connected to current limiting transistor 160 and is operable to turn off transistor 160 when the current rises above a certain threshold. Current detector circuitry 162 may comprise the circuitry shown in FIG. 2. However, other possible circuitry will be apparent to those skilled in the art.

Figure 6:
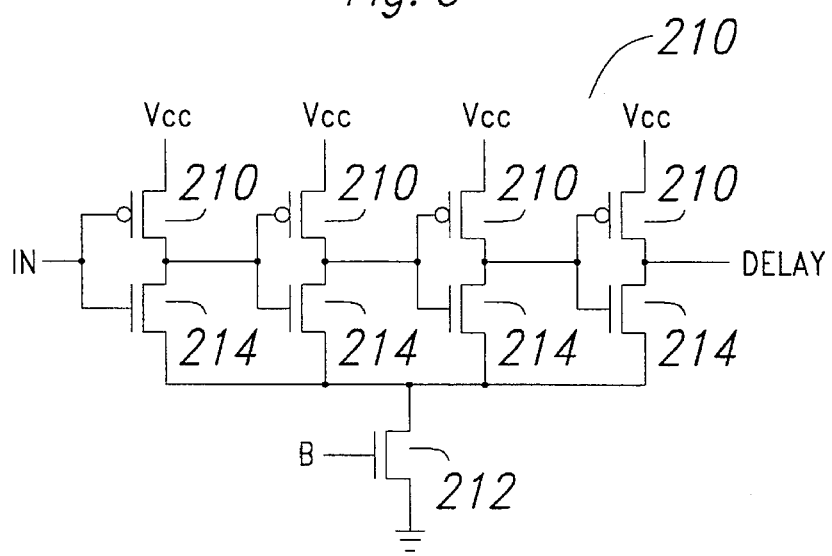
FIG. 6 is a schematic diagram of the preferred embodiment of the invention applied to a delay circuit.

FIG. 6 shows the preferred embodiment of the invention applied to a delay chain 200. Delay chain 200 consists of a plurality of inverters 210 connected in series. In operation, only one of the inverters is transitioning at any time. Accordingly, the current could be limited to that required for one inverter to transition. Current limiting transistor 212 is placed between inverters 210 and ground. Alternatively, transistor 212 may be placed between inverters 210 and Vcc. The gate of transistor 212 may be tied to Vcc and sized such that its width is much smaller than the total width of n-channel transistors 214. Alternatively, the principles of a standby mode or transient dose protection could be applied as described in the above examples.

While this invention has been described With reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
  a. a functional circuit comprising a plurality of circuit elements, each of said circuit elements operable to provide a conductive path, wherein less than all of said plurality of circuit elements are active at any one time; and
  b. a current limiting circuit in addition to said functional circuit connected between said plurality of circuit elements and a first voltage, wherein said current limiting circuit comprises at least one transistor and is operable to supply less than a selected current level to said plurality of elements, said current level being less than a current level required to operate all of said plurality of circuit elements, and wherein a plurality of said plurality of circuit elements are each connected between said current limiting transistor and an output node of the functional circuit.

2. The integrated circuit of claim 1, wherein said current limiting circuit is responsive to a control signal such that said current limiting circuit is operable to change from a first conductivity state to a second conductivity state in response to said control signal.

3. The integrated circuit of claim 2, wherein said control signal comprises a chip enable signal.

4. The integrated circuit of claim 2, wherein said control signal comprises a block enable signal.

5. The integrated circuit of claim 2 wherein said control signal comprises a transient dose detection signal.

6. A semiconductor device comprising:
  a logic circuit having a plurality of potentially conducting paths connected in parallel between an output node and a current limiting device, wherein said current limiting device is connected to a first voltage such that said current limiting device supplies current to said logic circuit and wherein said current limiting device is responsive to transient dose detection signal such that said current limiting device is operable to interrupt power to said logic circuit in response to a standby condition indicated by said transient dose detection signal.

7. The device of claim 6, wherein said first voltage is a supply voltage.

8. The device of claim 6, wherein said first voltage is a ground voltage.

9. The device of claim 6, wherein said current limiting device comprises a CMOS transistor.

10. An integrated circuit comprising:

a. a memory array;

b. logic circuitry comprising a plurality of circuit elements; and c. a current limiting device connected between said logic circuitry and a first voltage, wherein said current limiting device is connected to each of said plurality of circuit elements and wherein said current limiting device limits the current to said plurality of circuit elements to a level less than that required for all of said plurality of circuit elements to be active at one time.

11. The integrated circuit of claim 10, wherein said plurality of circuit elements comprises a plurality of word-line drivers.

12. The integrated circuit of claim 10, wherein said plurality of circuit elements comprises a sense amplifier and a bit-line driver.

13. The integrated circuit of claim 10, wherein less than all of said plurality of circuit elements are active at any one time.

14. The integrated circuit of claim 10, where said circuitry is CMOS circuitry.

15. A method of selectively limiting the current to a circuit comprising the steps off a. providing a current limiting transistor between a supply voltage and said circuit;

b. detecting whether a current level through an off transistor exceeds a threshold level;

c. providing a first signal level to a gate of said current limiting transistor when said current level is less than said threshold level such that said current limiting transistor connects said supply voltage to said circuit; and d. providing a second signal level to said gate when said current level exceeds said threshold level such that said current limiting transistor interrupts said supply voltage from said circuit.

16. The method of claim 15, wherein said current limiting transistor comprises a CMOS transistor.

17. The method of claim 15, further comprising the step of placing said circuit is a preferred state when said current limiting transistor interrupts said supply voltage from said circuit.

18. A method of reducing the probability of data corruption in an integrated circuit, comprising the steps of:

a. providing a plurality of field effect transistors connected in parallel;

b. providing a current limiting transistor connected between said plurality of field effect transistors and a first voltage, wherein said current limiting transistor has a width less than the total width of said plurality of field effect transistors;

c. conducting current through said current limiting transistor;

d. limiting said current to a threshold current level wherein the probability of data corruption is reduced by said step of limiting said current to said threshold current level.

19. The method of claim 18 wherein said threshold current level is less than a full current level required to transition all of said plurality of field effect transistors.

20. The method of claim 18 wherein said threshold current level is approximately equal to a single current level required to transition only one of said plurality of field effect transistors.

21. The method of claim 18 wherein said step of conducting current comprises the step of grounding a gate of said current limiting transistor.

22. The method of claim 18 wherein said step of conducting current comprises the step of connecting a chip enable signal to a gate of said current limiting transistor.

23. The method of claim 18 wherein said step of conducting current comprises the step of connecting a block enable signal to a gate of said current limiting transistor.

24. An integrated circuit comprising:

a functional circuit comprising a plurality of circuit elements, each of said circuit elements operable to provide a conductive path, wherein less than all of said plurality of circuit elements are active at any one time;

a current limiting circuit in addition to said functional circuit connected between said plurality of circuit elements and a first voltage, wherein said current limiting circuit comprises at least one transistor having a first conductivity state operable to supply a selected current level to said plurality of circuit elements, said selected current level being sufficient to operate at least one of said plurality of circuit elements but less than all of said plurality of circuit elements; and wherein said current limiting circuit is responsive to a binary control signal for changing said current limiting circuit from said first conductivity state to a second conductivity state wherein said current limiting circuit is operable to supply a reduced current level less than that required to operate one of said plurality of circuit elements.

25. The integrated circuit of claim 24, wherein said binary control signal comprises a chip enable signal.

26. The integrated circuit of claim 24, wherein said binary control signal comprises a block enable signal.

27. The integrated circuit of claim 24, wherein said binary control signal comprises a transient dose detection signal.

* * * * *